(12) United States Patent
Okawara et al.

(10) Patent No.: US 9,685,512 B2
(45) Date of Patent: Jun. 20, 2017

(54) SEMICONDUCTOR DEVICE

(71) Applicant: Toyota Jidosha Kabushiki Kaisha, Toyota-shi, Aichi-ken (JP)

(72) Inventors: Jun Okawara, Nisshin (JP); Yusuke Yamashita, Nagakute (JP); Satoru Machida, Nagakute (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/061,469

(22) Filed: Mar. 4, 2016

(65) Prior Publication Data

US 2016/0260710 A1 Sep. 8, 2016

(30) Foreign Application Priority Data

Mar. 6, 2015 (JP) ................................. 2015-045292

(51) Int. Cl.
| | |
|---|---|
| *H01L 29/10* | (2006.01) |
| *H01L 29/739* | (2006.01) |
| *H01L 29/06* | (2006.01) |
| *H01L 27/07* | (2006.01) |
| *H01L 29/36* | (2006.01) |
| *H01L 29/861* | (2006.01) |

(52) U.S. Cl.
CPC ...... *H01L 29/1095* (2013.01); *H01L 27/0727* (2013.01); *H01L 29/0623* (2013.01); *H01L 29/7397* (2013.01); *H01L 29/36* (2013.01); *H01L 29/861* (2013.01)

(58) Field of Classification Search
CPC H01L 27/0664; H01L 29/0642; H01L 29/872
See application file for complete search history.

(56) References Cited

U.S. PATENT DOCUMENTS

| | | | | |
|---|---|---|---|---|
| 7,602,045 | B2* | 10/2009 | Nagase | H01L 29/861 257/565 |
| 8,080,853 | B2* | 12/2011 | Tsuzuki | H01L 27/0664 257/330 |
| 8,680,607 | B2* | 3/2014 | Zeng | H01L 29/407 257/327 |
| 9,129,936 | B2* | 9/2015 | Darwish | H03K 17/687 |
| 9,142,552 | B2* | 9/2015 | Goerlach | H01L 29/66143 |
| 9,184,258 | B2* | 11/2015 | Yoshioka | H01L 29/66462 |

(Continued)

FOREIGN PATENT DOCUMENTS

JP 2013-048230 A 3/2013

*Primary Examiner* — Scott B Geyer
*Assistant Examiner* — S. M. S Imtiaz
(74) *Attorney, Agent, or Firm* — Dinsmore & Shohl LLP

(57) ABSTRACT

A semiconductor device includes a diode region and an IGBT region. The diode region includes a front side anode region, an n-type diode barrier region, an n-type diode pillar region reaching the diode barrier region through the front side anode region, and a p-type back side anode region separated from the front side anode region by the diode barrier region. The IGBT region includes a front side body region, an n-type IGBT barrier region, and a back side body region separated from the front side body region by the IGBT barrier region. When a gate-off voltage is applied to a gate electrode, a resistance between the IGBT barrier region and the emitter electrode is higher than a resistance between the diode barrier region and the anode electrode.

8 Claims, 9 Drawing Sheets

(56) References Cited

U.S. PATENT DOCUMENTS

| | | | | |
|---|---|---|---|---|
| 9,214,458 B2* | 12/2015 | Hino | ................... | H01L 29/1608 |
| 9,219,138 B2* | 12/2015 | Roig-Guitart | ....... | H01L 29/0646 |
| 9,276,137 B2* | 3/2016 | Yamashita | ............ | H01L 29/872 |
| 9,324,787 B2* | 4/2016 | Ota | ......................... | H01L 29/36 |
| 9,368,649 B2* | 6/2016 | Chun | ................... | H01L 29/872 |
| 2002/0195656 A1* | 12/2002 | Hattori | ................ | H01L 29/7397 |
| | | | | 257/330 |
| 2005/0073030 A1* | 4/2005 | Inoue | ................... | H01L 29/861 |
| | | | | 257/656 |
| 2006/0006458 A1* | 1/2006 | Motai | ................ | H01L 29/0634 |
| | | | | 257/330 |
| 2006/0197152 A1* | 9/2006 | Tokano | ............... | H01L 29/0634 |
| | | | | 257/341 |
| 2008/0191307 A1* | 8/2008 | Darwish | ............. | H01L 29/0649 |
| | | | | 257/493 |
| 2008/0296587 A1* | 12/2008 | Yamamoto | .......... | H01L 29/0619 |
| | | | | 257/77 |
| 2009/0057832 A1* | 3/2009 | Kouno | ................ | H01L 29/7397 |
| | | | | 257/577 |
| 2009/0173995 A1* | 7/2009 | Takahashi | ........... | H01L 29/0696 |
| | | | | 257/330 |
| 2012/0043581 A1* | 2/2012 | Koyama | ............ | H01L 29/0696 |
| | | | | 257/140 |
| 2013/0240947 A1* | 9/2013 | Matsudai | ............ | H01L 29/7395 |
| | | | | 257/139 |
| 2014/0048847 A1* | 2/2014 | Yamashita | ............ | H01L 29/407 |
| | | | | 257/140 |
| 2014/0054645 A1* | 2/2014 | Saito | .................. | H01L 29/0696 |
| | | | | 257/139 |

* cited by examiner

SEMICONDUCTOR DEVICE

CROSS-REFERENCE TO RELATED APPLICATIONS

This application claims priority to Japanese Patent Application No. 2015-045292 filed on Mar. 6, 2015, the entire contents of which are hereby incorporated by reference into the present application.

TECHNICAL FIELD

The present specification relates to a semiconductor device.

DESCRIPTION OF RELATED ART

Japanese Patent Application Publication No. 2013-048230 discloses a semiconductor device having a diode. Hereinafter, Japanese Patent Application Publication No. 2013-048230 will be referred to as Patent Literature 1. An anode region of this diode is separated into two regions by an n-type barrier region. That is, the anode region is separated into a front side anode region and a back side anode region. An n-type cathode region is provided under the back side anode region. The diode has an n-type pillar region that reaches a barrier region through the front side anode region from a front surface of a semiconductor substrate. The pillar region is connected to an anode electrode at an upper end portion thereof. In addition, the pillar region is connected to the barrier region at a lower end portion thereof. That is, the pillar region forms a current path that bypasses the front side anode region. As a forward voltage applied to the diode is increased, a current flows from the anode electrode through the pillar region, the barrier region, and the back side anode region to the cathode region. Since major carriers of this current are electrons, holes are hardly injected into the cathode region even when the current flows. Further, since the barrier region is connected to the anode electrode by the pillar region, even when the forward voltage is applied to the diode, a potential difference hardly occurs at a p-n junction at the boundary between the front side anode region and the barrier region. Therefore, this p-n junction is not turned on in this stage. When the forward voltage is further increased, the p-n junction at the boundary between the front side anode region and the barrier region is turned on. Thereby, holes are injected into the cathode region from the front side anode region through the barrier region and the back side anode region. Thus, in this diode, the p-n junction at the boundary between the front side anode region and the barrier region is hardly turned on when the forward voltage applied to the diode is increased, whereby injection of holes into the cathode region is suppressed. When the voltage applied to the diode is switched from the forward voltage to a reverse voltage, the diode executes a reverse recovery operation. That is, the holes in the cathode region are discharged to the anode electrode, and a reverse recovery current flows in the diode. In this diode, since fewer holes are injected into the cathode region while the forward voltage is applied to the diode, fewer holes are discharged from the cathode region to the anode electrode while the diode executes the reverse recovery operation. Therefore, the reverse recovery current hardly flows in the diode. This phenomenon is more prominent in the case where the voltage applied to the diode is switched to the reverse voltage in a shorter time from when the forward voltage is applied to the diode.

Further, Patent Literature 1 discloses a semiconductor device (so-called RC-IGBT) in which an IGBT and the above-mentioned diode are provided on a common semiconductor substrate. The anode region of the diode and a body region (a p-type region in which a channel is formed when a gate-on voltage is applied) of the IGBT are provided in a continuous layer shape in the manufacturing process. Therefore, like the anode region of the diode, the body region of the IGBT is separated into a front side body region and a back side body region by a barrier region. The IGBT also has an n-type pillar region that connects a barrier region and an emitter electrode.

SUMMARY

In the manufacturing process of the semiconductor device, a local formation defect may occur in the barrier region of the IGBT. The formation defect of the barrier region degrades the reliability of the semiconductor device. Further, the local formation defect of the barrier region in the semiconductor device causes a phenomenon that a collector current of the IGBT increases stepwise when a gate voltage is increased. Therefore, the semiconductor device having the formation defect of the barrier region can be screened by measuring characteristics of the gate voltage and the collector current.

On the other hand, in the diode having the front side anode region and the back side anode region separated by the barrier region as described in Patent Literature 1, there are cases where the p-type impurity concentration of the back side anode region is set to be lower than the p-type impurity concentration of the front side anode region. The reason is as follows. If the p-type impurity concentrations of the front side anode region and the back side anode region are both high, p-type impurities may diffuse from both the front side anode region and the back side anode region into a region where an n-type barrier region is to be provided, and this region may become a p-type region. When the p-type impurity concentration of the back side anode region is lower than the p-type impurity concentration of the front side anode region, the p-type impurity concentration of the back side body region in the RC-IGBT becomes lower than the p-type impurity concentration of the front side body region thereof. Then, in the process of increasing the gate voltage to turn on the IGBT, a bypass current flows bypassing the front side body region. That is, since the p-type impurity concentration of the back side body region is lower than the p-type impurity concentration of the front side body region, a channel is formed earlier in the back side body region than in the front side body region in the process of increasing the gate voltage of the IGBT. This channel connects the drift region and the barrier region of the IGBT. Then, the bypass current flows from the drift region through the channel in the back side body region, the barrier region, and the pillar region to the emitter electrode. That is, the bypass current flows bypassing the front side body region. Thereafter, when the gate voltage is further increased, a channel is formed also in the front side body region, and the IGBT is turned on. In this way, when the p-type impurity concentration of the back side body region is low, the bypass current flows in the process of turning on the IGBT. The bypass current flowing in the process of turning on the IGBT causes a phenomenon that the collector current of the IGBT increases stepwise when the gate voltage is increased.

As described above, in the RC-IGBT having the low p-type impurity concentration of the back side body region, the phenomenon that the collector current increases stepwise occurs therein, similar to the IGBT in which a formation defect of the barrier region occurs. Therefore, in this RC-IGBT, whether a formation defect occurs in the barrier region cannot be examined on the basis of the characteristics. Accordingly, the present specification provides, in an RC-IGBT having a front side body region and a back side body region, a technique of suppressing a bypass current in the process of turning on the IGBT.

A semiconductor device disclosed in the present specification includes a semiconductor substrate including a diode region and an IGBT region. In addition, the semiconductor device includes: an anode electrode provided on a front surface of the semiconductor substrate in the diode region; a cathode electrode provided on a rear surface of the semiconductor substrate in the diode region; an emitter electrode provided on the front surface of the semiconductor substrate in the IGBT region; a collector electrode provided on the rear surface of the semiconductor substrate in the IGBT region; a gate insulating film; and a gate electrode. The diode region includes a front side anode region, a diode barrier region, a diode pillar region, a back side anode region, and a cathode region. The front side anode region is a p-type region connected to the anode electrode. The diode barrier region is an n-type region provided on a back side of the front side anode region. The diode pillar region is an n-type region connected to the anode electrode. The diode pillar region reaches the diode barrier region through the front side anode region from the front surface of the semiconductor substrate. The back side anode region is a p type region provided on a back side of the diode barrier region, separated from the front side anode region by the diode barrier region, and having a p-type impurity concentration lower than a p-type impurity concentration of the front side anode region. The cathode region is an n-type region provided on a back side of the back side anode region, separated from the diode barrier region by the back side anode region and connected to the cathode electrode. The IGBT region includes an emitter region, a front side body region, an IGBT barrier region, a back side body region, an IGBT drift region, and a collector region. The emitter region is an n-type region connected to the emitter electrode. The front side body region is a p-type region provided on a back side of the emitter region. The IGBT barrier region is an n-type region provided on a back side of the front side body region and separated from the emitter region by the front side body region. The back side body region is a p-type region provided on a back side of the IGBT barrier region, separated from the front side body region by the IGBT barrier region, and having a p-type impurity concentration lower than a p-type impurity concentration of the front side body region. The IGBT drift region is an n-type region provided on a back side of the back side body region, connected to the cathode region, and separated from the IGBT barrier region by the back side body region. The collector region is a p-type region provided on a back side of the IGBT drift region, separated from the back side body region by the IGBT drift region, and connected to the collector electrode. The gate electrode faces, via the gate insulating film, the front side body region and the back side body region that are located in a range where the emitter region and the IGBT drift region are separated. A resistance between the IGBT barrier region and the emitter electrode is higher than a resistance between the diode barrier region and the anode electrode when a gate-off voltage is applied to the gate electrode.

In the case where the diode barrier region is separated into a plurality of regions by trenches or the like, the resistance between the IGBT barrier region and the emitter electrode may be higher than the resistance between at least one diode barrier region and the anode electrode. Further, when the IGBT barrier region is separated into a plurality of regions by trenches or the like, the resistance between each IGBT barrier region and the emitter electrode may be higher than the resistance between at least one diode barrier region and the emitter electrode.

The emitter electrode and the anode electrode may be configured as a single common electrode. The collector electrode and the cathode electrode may be configured as a single common electrode.

A pillar region (IGBT pillar region) connecting the IGBT barrier region and the emitter electrode may be provided in the IGBT region. In this case, the resistance of the IGBT pillar region can be made higher than the resistance of the diode pillar region. The resistance between the IGBT barrier region and the emitter region may be increased by providing no IGBT pillar region.

In this semiconductor device, since the resistance between the diode barrier region in the diode region and the anode electrode is small, a p-n junction at the boundary between the diode barrier region and the front side anode region is hardly turned on when the diode is turned on. Thereby, injection of holes from the front side anode region to the cathode region can be effectively suppressed. Therefore, a reverse recovery current of the diode can be effectively suppressed. Further, in this semiconductor device, the resistance between the IGBT barrier region in the IGBT region and the emitter electrode is high. Therefore, even in the state where a channel is not formed in the front side body region while a channel is formed in the back side body region in the process of turning on the IGBT, flow of a bypass current between the IGBT barrier region and the emitter electrode can be suppressed. Thus, according to the semiconductor device, the reverse recovery current of the diode can be effectively suppressed, and the bypass current in the process of turning on the IGBT can be suppressed. Accordingly, in the case of mass-producing the semiconductor device, semiconductor devices in which barrier region formation defects occur can be screened on the basis of the characteristics thereof.

DETAILED DESCRIPTION OF THE EMBODIMENTS

First Embodiment

Figure 1:
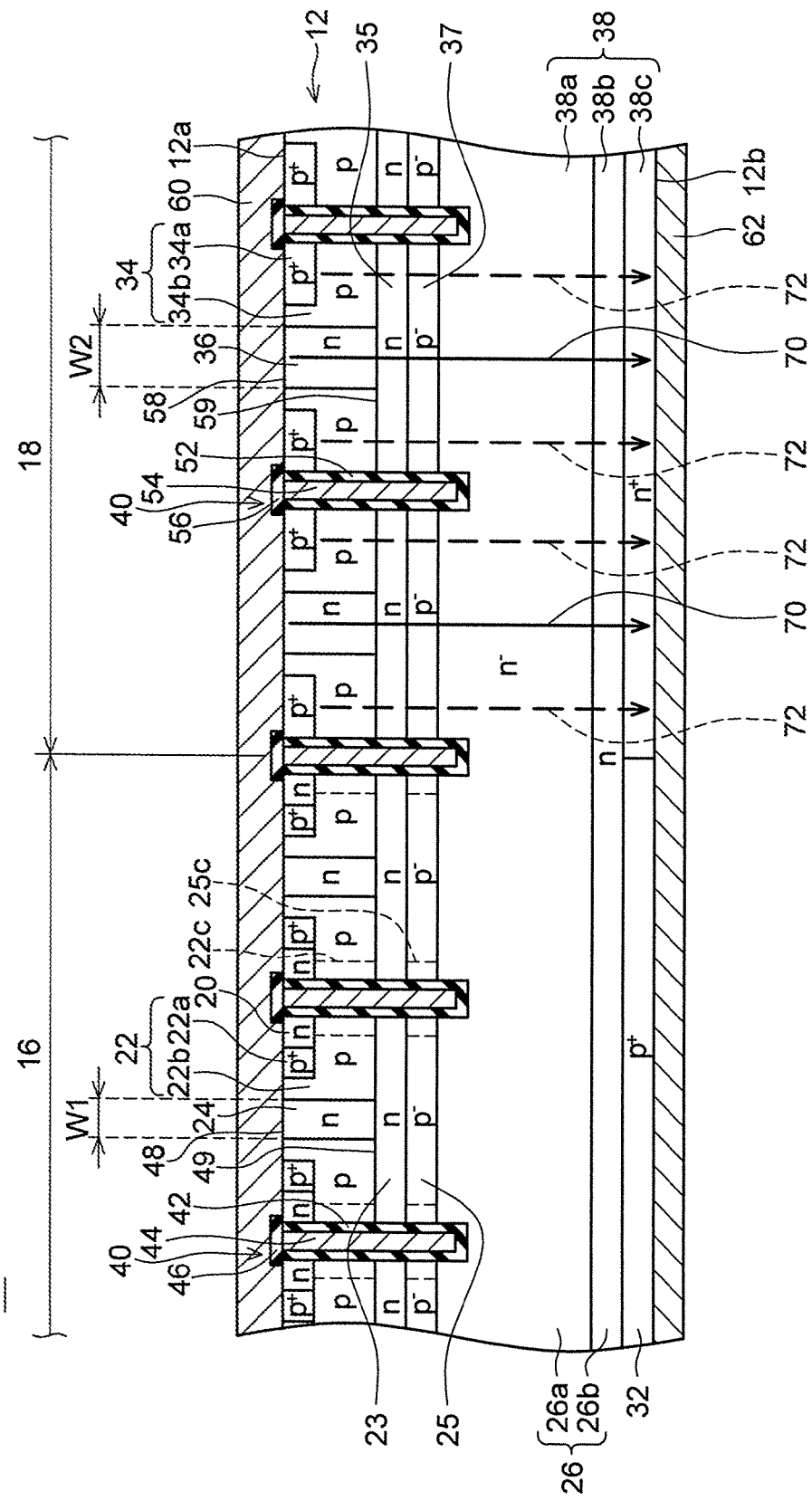
FIG. 1 is a vertical cross-sectional view of a semiconductor device 10 according to First Embodiment.

A semiconductor device 10 according to First Embodiment shown in FIG. 1 is composed of a semiconductor substrate 12, and electrodes, insulators and the like provided on a front surface 12a and a rear surface 12b of the semiconductor substrate 12. The semiconductor substrate 12 includes an IGBT region 16 in which an IGBT is provided, and a diode region 18 in which a diode is provided. In other words, the semiconductor device 10 is a so-called RC-IGBT.

The semiconductor substrate 12 is made of silicon. A plurality of trenches 40 is provided at the front surface 12a of the semiconductor substrate 12. The trenches 40 extend in parallel to each other in a direction vertical to a sheet surface of FIG. 1.

An inner surface of each trench 40 in the IGBT region 16 is covered with a gate insulating film 42. A gate electrode 44 is disposed in each trench 40 in the IGBT region 16. The gate electrode 44 is insulated from the semiconductor substrate 12 by the gate insulating film 42. A front surface of each gate electrode 44 is covered with an inter-layer insulating film 46.

An inner surface of each trench 40 in the diode region 18 is covered with an insulating film 52. A control electrode 54 is disposed in each trench 40 in the diode region 18. Each control electrode 54 is insulated from the semiconductor substrate 12 by the insulating film 52. A front surface of each control electrode 54 is covered with an inter-layer insulating film 56. A potential of the control electrodes 54 is controlled independently from a potential of the gate electrodes 44.

An upper electrode 60 is provided on the front surface 12a of the semiconductor substrate 12. The upper electrode 60 is insulated from the gate electrodes 44 by the inter-layer insulating films 46, and insulated from the control electrodes 54 by the inter-layer insulating films 56. A lower electrode 62 is provided on the rear surface 12b of the semiconductor substrate 12.

Emitter regions 20, a front side body region 22, an IGBT barrier region 23, IGBT pillar regions 24, a back side body region 25, a drift region 26, and a collector region 32 are provided in the IGBT region 16.

The emitter regions 20 are n-type regions, and are exposed at the front surface 12a of the semiconductor substrate 12. Each emitter region 20 is in ohmic contact with the upper electrode 60. Each emitter region 20 is in contact with the gate insulating films 42.

The front side body region 22 includes body contact regions 22a and a low-concentration body region 22b.

Each body contact region 22a is a p-type region containing high-concentration p-type impurities. Each body contact region 22a is exposed at the front surface 12a of the semiconductor substrate 12. Each body contact region 22a is in ohmic contact with the upper electrode 60. The body contact region 22a is adjacent to the emitter region 20.

The low-concentration body region 22b is a p-type region having a p-type impurity concentration lower than that of the body contact regions 22a. The low-concentration body region 22b is provided under the emitter region 20 and the body contact region 22a. The low-concentration body region 22b is in contact with the gate insulating film 42 at a portion thereof under each emitter region 20. In addition, a portion, adjacent to each body contact region 22a, of the low-concentration body region 22b is exposed at the front surface 12a of the semiconductor substrate 12.

The IGBT barrier region 23 is an n-type region, and is provided under the low-concentration body region 22b. A p-n junction 49 is formed at the boundary between the IGBT barrier region 23 and the low-concentration body region 22b. The IGBT barrier region 23 is separated from the emitter regions 20 by the front side body region 22. The IGBT barrier region 23 is in contact with each gate insulating film 42 at a position thereof under the low-concentration body region 22b.

Each IGBT pillar region 24 is provided in each of regions sandwiched by the corresponding trenches 40 in the IGBT region 16. The IGBT pillar regions 24 are n-type regions adjacent to the front side body region 22. Each IGBT pillar region 24 is elongated from the front surface 12a of the semiconductor substrate 12 in a thickness direction of the semiconductor substrate 12. Each IGBT pillar region 24 penetrates the front side body region 22 and reaches the IGBT barrier region 23. A lower end of each IGBT pillar region 24 is joined to the IGBT barrier region 23. An upper end of each IGBT pillar region 24 is in Schottky contact with the upper electrode 60. In other words, a Schottky junction 48 is formed between each IGBT pillar region 24 and the upper electrode 60. A width W1 of the IGBT pillar regions 24 is substantially constant from their upper end to lower end.

The back side body region 25 is a p-type region, and is provided under the IGBT barrier region 23. The back side body region 25 is separated from the front side body region 22 by the IGBT barrier region 23. The back side body region 25 has a p-type impurity concentration lower than that of the low-concentration body region 22b. The back side body region 25 is in contact with each gate insulating film 42 at a portion thereof under the IGBT barrier region 23.

The drift region 26 includes a low-concentration drift region 26a and a buffer region 26b.

The low-concentration drift region 26a is an n-type region containing n-type impurities having a concentration lower than the concentrations of the emitter regions 20 and the buffer region 26b. The low-concentration drift region 26a is provided under the back side body region 25. The low-concentration drift region 26a is separated from the IGBT barrier region 23 by the back side body region 25. The low-concentration drift region 26a is in contact with each gate insulating film 42 near a lower end portion of the corresponding trench 40, at a portion thereof under the back side body region 25.

The buffer region 26b is an n-type region containing n-type impurities at a concentration higher than the impurity concentration of the low-concentration drift region 26a. The buffer region 26b is provided under the low-concentration drift region 26a.

The collector region 32 is a p-type region containing high-concentration p-type impurities. The collector region 32 is provided under the buffer region 26b. The collector region 32 is separated from the back side body region 25 by the drift region 26. The collector region 32 is exposed at the rear surface 12b of the semiconductor substrate 12. The collector region 32 is in ohmic contact with the lower electrode 62.

In the IGBT region 16, an IGBT connected between the upper electrode 60 and the lower electrode 62 is provided of the emitter region 20, the front side body region 22, the IGBT barrier region 23, the IGBT pillar region 24, the back side body region 25, the drift region 26, the collector region 32, the gate electrode 44, and the like. When the semiconductor device 10 operates as the IGBT, the upper electrode 60 serves as an emitter electrode and the lower electrode 62 serves as a collector electrode.

Front side anode regions 34, a diode barrier region 35, diode pillar regions 36, a back side anode region 37, and a cathode region 38 are provided in the diode region 18.

The front side anode region 34 includes anode contact regions 34a and a low-concentration anode region 34b.

The anode contact regions 34a are p-type regions containing high-concentration p-type impurities. Each anode contact region 34a is exposed at the front surface 12a of the semiconductor substrate 12. Each anode contact region 34a is in ohmic contact with the upper electrode 60.

The low-concentration anode region 34b is a p-type region having a p-type impurity concentration lower than that of the anode contact regions 34a. The low-concentration anode region 34b is provided in an area around each anode contact region 34a, including an area under each anode contact region 34a. The low-concentration anode region 34b is in contact with the insulating film 52. A portion of the low-concentration anode region 34b is exposed at the front surface 12a of the semiconductor substrate 12, at a position where the low-concentration anode region 34b is adjacent to each anode contact region 34a.

The diode barrier region 35 is an n-type region, and is provided under the low-concentration anode region 34b. A p-n junction 59 is formed at the boundary between the diode barrier region 35 and the low-concentration anode region 34b. The diode barrier region 35 is in contact with the insulating film 52 at a portion thereof under the low-concentration anode region 34b. The diode barrier region 35 is provided at substantially the same depth as the IGBT barrier region 23 in the IGBT region 16.

Each diode pillar region 36 is provided in each of regions sandwiched by the corresponding trenches 40 in the diode region 18. The diode pillar regions 36 are n-type regions adjacent to the front side anode region 34. Each diode pillar region 36 is elongated in the thickness direction of the semiconductor substrate 12 from the front surface 12a of the semiconductor substrate 12. Each diode pillar region 36 penetrates the front side anode region 34 and reaches the diode barrier region 35. A lower end of each diode pillar region 36 is joined to the diode barrier region 35. An upper end of each diode pillar region 36 is in Schottky contact with the upper electrode 60. In other words, a Schottky junction 58 is formed between each diode pillar region 36 and the upper electrode 60. A width W2 of the diode pillar region 36 is substantially constant from the upper end to the lower end. The width W2 of the diode pillar regions 36 is larger than the width W1 of the IGBT pillar regions 24 in the IGBT region 16. The n-type impurity concentration of the diode pillar regions 36 is substantially equal to the n-type impurity concentration of the IGBT pillar regions 24 in the IGBT region 16.

The back side anode region 37 is a p-type region and is provided under the diode barrier region 35. The back side anode region 37 is separated from the front side anode region 34 by the diode barrier region 35. The p-type impurity concentration of the back side anode region 37 is lower than the p-type impurity concentration of the low-concentration anode region 34b. The back side anode region 37 is in contact with each insulating film 52 at a portion thereof under the diode barrier region 35. The back side anode region 37 is provided at substantially the same depth as the back side body region 25 in the IGBT region 16.

The cathode region 38 is an n-type region continuous to the drift region 26. The cathode region 38 includes a low-concentration drift region 38a, a buffer region 38b, and a cathode contact region 38c.

The low-concentration drift region 38a is provided under the back side anode region 37. The low-concentration drift region 38a is separated from the diode barrier region 35 by the back side anode region 37. The low-concentration drift region 38a is in contact with each insulating film 52 near the lower end portion of the corresponding trench 40, at a portion thereof under the back side anode region 37. The low-concentration drift region 38a has an n-type impurity concentration substantially equal to that of the low-concentration drift region 26a in the IGBT region 16. The low-concentration drift region 38a is continuous to the low-concentration drift region 26a in the IGBT region 16.

The buffer region 38b is provided under the low-concentration drift region 38a. The buffer region 38b is an n-type region containing n-type impurities at a concentration higher than the impurity concentration of the low-concentration drift region 38a. The buffer region 38b has substantially the same n-type impurity concentration as that of the buffer region 26b in the IGBT region 16. The buffer region 38b is continuous to the buffer region 26b in the IGBT region 16.

The cathode contact region 38c is an n-type region containing n-type impurities at a concentration higher than the impurity concentration of the buffer region 38b. The cathode contact region 38c is provided under the buffer region 38b. The cathode contact region 38c is exposed at the rear surface 12b of the semiconductor substrate 12. The cathode contact region 38c is in ohmic contact with the lower electrode 62. The cathode contact region 38c is adjacent to the collector region 32 in the IGBT region 16.

In the diode region 18, a diode connected between the upper electrode 60 and the lower electrode 62 is provided of the front side anode regions 34, the diode barrier region 35, the diode pillar regions 36, the back side anode region 37, the cathode region 38 and the like. Since the p-type impurity concentration of the back side anode region 37 is low, when this diode is turned on, carriers pass through the back side anode region 37. That is, a p-n junction 59 at the boundary between the front side anode region 34 and the diode barrier region 35 functions as a substantial p-n diode, and the back side anode region 37 functions as a current path. When the semiconductor device 10 operates as the diode, the upper electrode 60 serves as an anode electrode, and the lower electrode 62 serves as a cathode electrode. That is, the diode is connected anti-parallel to the IGBT.

As described above, the width W1 of each IGBT pillar region 24 is smaller than the width W2 of each diode pillar region 36. Therefore, when the pillar regions 24 and 36 are cut along a plane parallel to the front surface 12a of the semiconductor substrate 12 (i.e., a plane vertical to the thickness direction of the semiconductor substrate 12), a cross-sectional area of each IGBT pillar region 24 is smaller than a cross-sectional area of each diode pillar region 36.

Next, a description will be given of resistances of the pillar regions 24 and 36 when a gate-off voltage is applied to the gate electrodes 44 (i.e., when channels are not formed in the body regions 22 and 25). In the state where a channel is not formed in the front side body region 22, current paths passing the IGBT pillar regions 24 have the smallest resistance among the current paths between the IGBT barrier region 23 and the upper electrode 60. Therefore, in this case, the resistance between the IGBT barrier region 23 and the upper electrode 60 depends on the resistance of the IGBT pillar regions 24. Since the width W1 of the IGBT pillar regions 24 is small (i.e., the cross-sectional area thereof is small), the resistance of the IGBT pillar regions 24 (i.e., the resistance between the IGBT barrier region 23 and the upper electrode 60) is high.

On the other hand, when a channel is not formed in the front side body region 22, current paths passing the diode pillar regions 36 have the smallest resistance among the current paths between the diode barrier region 35 and the upper electrode 60. Therefore, in this case, the resistance between the diode barrier region 35 and the upper electrode 60 depends on the resistance of the diode pillar regions 36. Since the width W2 of the diode pillar regions 36 is large (i.e., the cross-sectional area thereof is large), the resistance of the diode pillar regions 36 (i.e., the resistance between the diode barrier region 35 and the upper electrode 60) is low.

Next, the operation of the diode in the diode region 18 will be described. It is assumed that a forward voltage applied to the diode (i.e., a voltage that causes the upper electrode 60 to be positive with respect to the lower electrode 62) is gradually increased. When the forward voltage exceeds a rising voltage of the Schottky junctions 58, the Schottky junctions 58 are turned on. Then, a current (hereinafter referred to as a current 70) flows as shown by solid-line arrows 70 in FIG. 1. In other words, electrons flow in the paths shown by the solid-line arrows 70 in the direction opposite to the arrows 70. More specifically, electrons flow from the lower electrode 62 through the cathode region 38, the back side anode region 37, the diode barrier region 35, and the diode pillar regions 36 to the upper electrode 60. Since the current 70 is generated by the flow of the electrons, holes are hardly injected into the low-concentration drift region 38a even when the current 70 flows. Further, in the diode region 18, the p-n junction 59 is formed by the front side anode region 34 and the diode barrier region 35. The voltage applied to the p-n junction 59 is substantially equal to the voltage applied across the upper electrode 60 and the diode barrier region 35. Since a rising voltage of the p-n junction 59 is higher than the rising voltage of the Schottky junctions 58, the p-n junction 59 is not turned on at this stage.

As the forward voltage is further increased, the current 70 is increased. Since the diode pillar regions 36 have the resistance as described above, the increase in the current 70 causes an increase in the voltage between the diode barrier region 35 and the upper electrode 60. When this voltage reaches the rising voltage of the p-n junction 59, the p-n junction 59 is turned on. Thereby, a current (hereinafter referred to as a current 72) flows as shown by broken-line arrows 72 in FIG. 1. In other words, along the broken-line arrows 72, holes flow from the upper electrode 60 through the front side anode region 34, the diode barrier region 35, the back side anode region 37, and the cathode region 38 to the lower electrode 62. Further, electrons flow in the paths shown by the broken-line arrows 72 in the direction opposite to the arrows 72. When the current 72 flows, holes are injected from the front side anode region 34 into the low-concentration drift region 38a.

As described above, in this diode, since the current 70 flows through the diode pillar regions 36, timing to turn on the p-n junction 59 is delayed. Therefore, injection of holes into the low-concentration drift region 38a is suppressed.

Thereafter, when the voltage applied to the diode is switched to a reverse voltage, the diode performs a reverse recovery operation. That is, the holes existing in the low-concentration drift region 38a are discharged to the upper electrode 60. Thereby, a reverse recovery current flows in the diode. Since injection of holes into the low-concentration drift region 38a is suppressed when the diode is in the ON state as described above, fewer holes are discharged from the low-concentration drift region 38a to the upper electrode 60 when the diode performs the reverse recovery operation. Therefore, the reverse recovery current hardly flows in the diode. Thus, the loss that occurs during the reverse recovery operation is small. This phenomenon is particularly prominent in a case where the voltage applied to the diode is switched to the reverse voltage in a short time from when the forward voltage is applied to the diode.

As described above, in the semiconductor device 10, the p-n junction 59 is less prone to being turned on because the current 70 flows in the diode pillar regions 36. Thereby, the injection of holes into the low-concentration drift region 38a is suppressed. Accordingly, the reverse recovery current can be suppressed. In particular, in the semiconductor device 10, the resistance of the diode pillar regions 36 is low because the width W2 of the diode pillar regions 36 is large. Thus, a potential difference hardly occurs in the diode pillar region 36. Therefore, the p-n junction 59 is less likely to be turned on, and injection of holes into the low-concentration drift region 38a is suppressed more effectively. That is, according to the semiconductor device 10, the reverse recovery current can be effectively suppressed.

A parasitic diode is formed due to the p-n junction 49 also in the IGBT region 16. In addition, the IGBT barrier region 23 under the p-n junction 49 is connected to the upper electrode 60 by the IGBT pillar regions 24. Therefore, when the forward voltage (i.e., the potential of the upper electrode 60) is increased as described above, first a current due to electrons flows in the IGBT pillar regions 24. Thereafter, when the forward voltage is further increased, the p-n junction 49 forming the parasitic diode is turned on. Thus, also in the IGBT region 16, timing to turn on the p-n junction 49 is delayed, and injection of holes from the front side body region 22 into the low-concentration drift regions 26a, 38a is suppressed. Also in this case, the reverse recovery current is suppressed.

Figure 2:
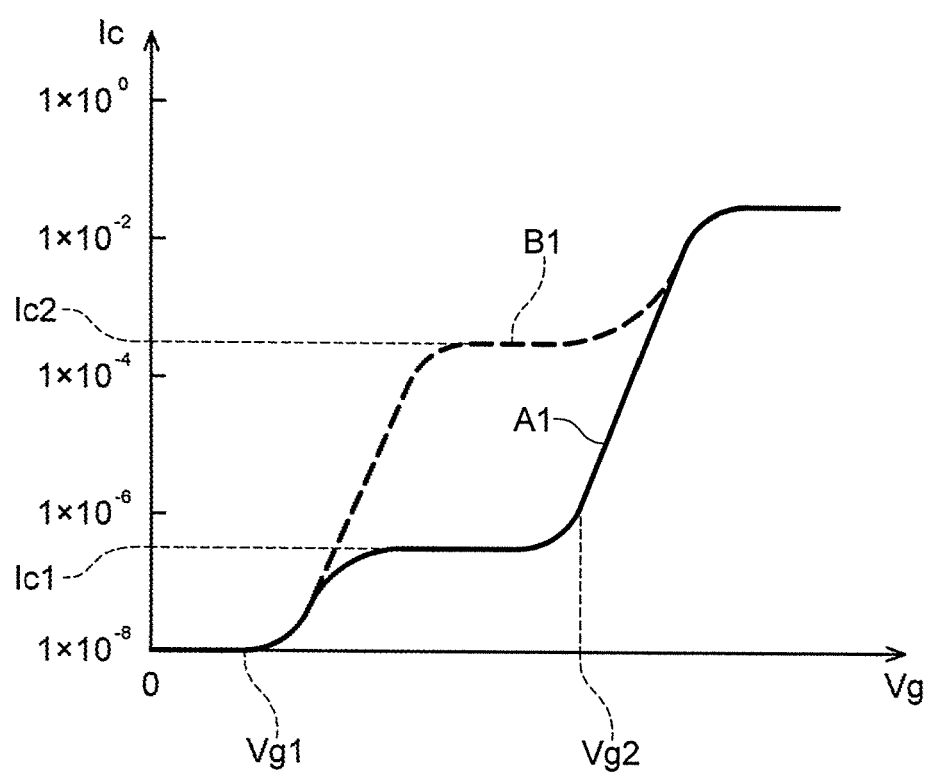
FIG. 2 is a graph showing a relationship between gate voltage Vg and collector current Ic.
Figure 3:
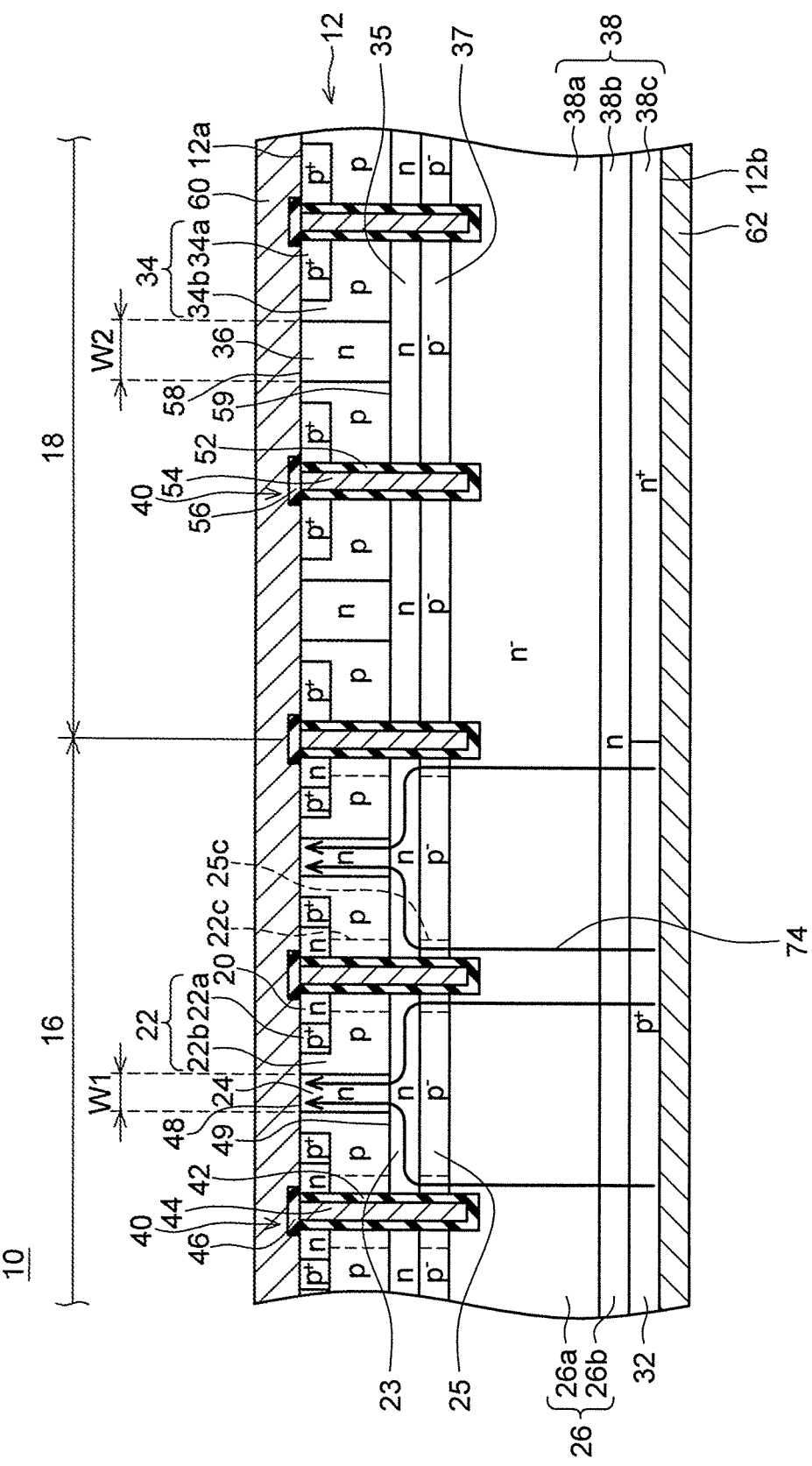
FIG. 3 is a vertical cross-sectional view of the semiconductor device 10 according to First Embodiment.

Next, the operation of the IGBT will be described. It is assumed that a voltage Vg (i.e., an emitter-to-gate voltage) of the gate electrode 44 is increased from 0 V, in the state where a voltage that causes the lower electrode 62 to have a potential higher than that of the upper electrode 60 is applied. A graph A1 shown in FIG. 2 shows the relationship between gate voltage Vg and collector current Ic in the semiconductor device 10 at this time. While the gate voltage Vg is near 0 V, the collector current Ic does not flow in the IGBT. As the voltage of the gate electrode 44 is increased, electrons are gathered to the low-concentration body region 22b in a range adjacent to the gate insulating films 42 (hereinafter referred to as gate vicinity regions 22c) and the back side body region 25 in ranges adjacent to the gate insulating films 42 (hereinafter referred to as gate vicinity regions 25c). When the voltage of the gate electrodes 44 is increased to a voltage Vg1, the gate vicinity regions 25c in the back side body region 25 are inverted to the n-type, and a channel is formed in each gate vicinity region 25c. Since the p-type impurity concentration of the low-concentration body region 22b is higher than the p-type impurity concentration of the back side body region 25, a channel is not formed in the gate vicinity regions 22c in the low-concentration body region 22b at this stage. When the channels are formed only in the back side body region 25, a bypass current 74 shown by arrows in FIG. 3 flows. The bypass current 74 bypasses the emitter regions 20 and the front side body region 22. More specifically, the bypass current 74 flows from the lower electrode 62 through the collector region 32, the drift region 26, the channels in the back side body region 25, the IGBT barrier region 23, and the IGBT pillar regions 24 to the upper electrode 60. Since the bypass current 74 flows in this way, as shown in FIG. 2, a collector current Ic1 having a magnitude corresponding to the bypass current 74 flows when the gate voltage Vg exceeds the voltage Vg1. In the present embodiment, however, the bypass current 74 (i.e., the collector current Ic1) is extremely small.

Figure 4:
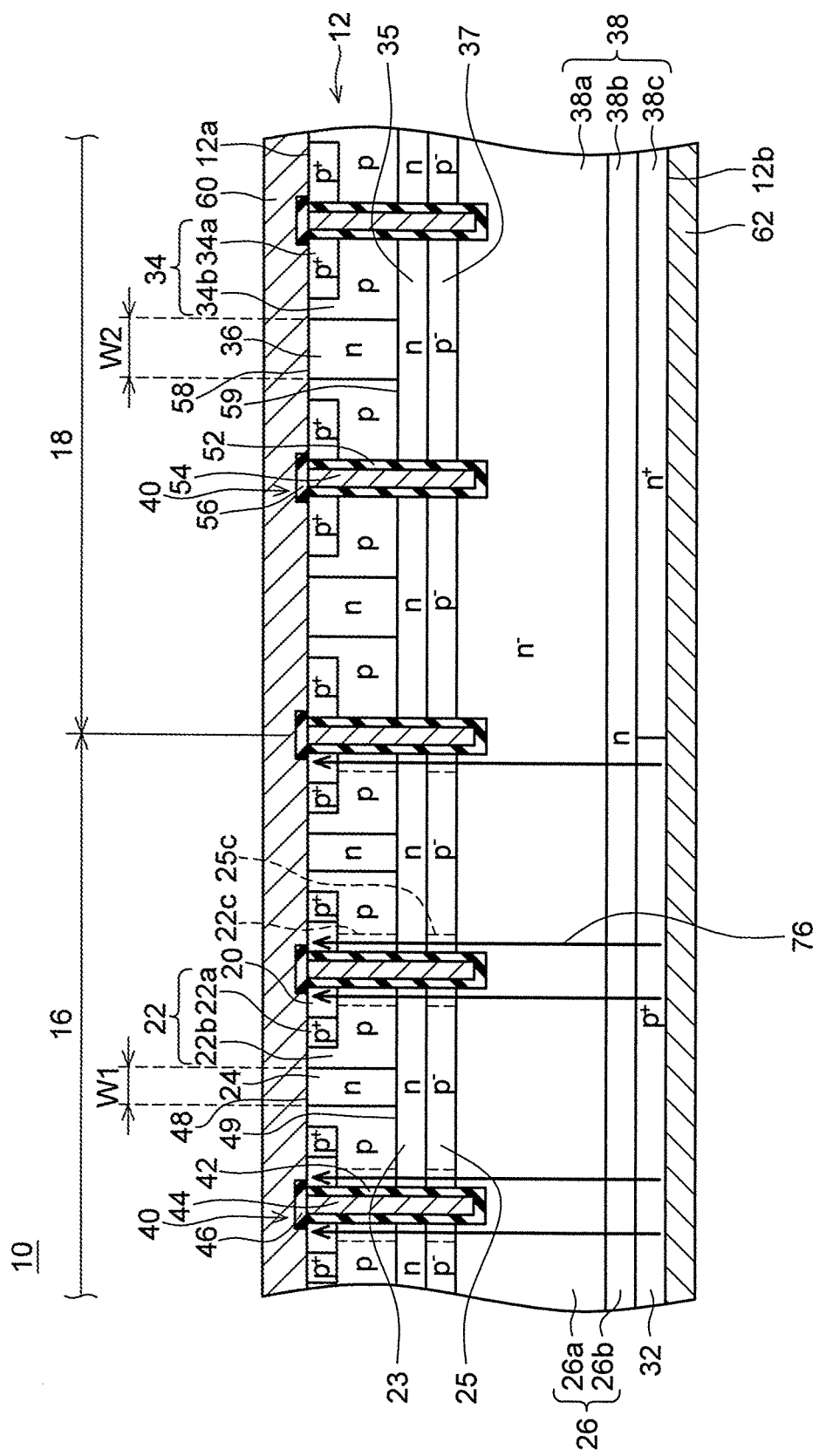
FIG. 4 is a vertical cross-sectional view of the semiconductor device 10 according to First Embodiment.

Thereafter, when the gate voltage Vg is increased to a gate-on voltage Vg2, a channel is formed also in each gate vicinity region 22c in the front side body region 22. Then, a main current 76 shown by an arrow in FIG. 4 flows. That is, the main current 76 flows from the lower electrode 62 through the collector region 32, the drift region 26, the channels in the back side body region 25, the IGBT barrier region 23, the channel in the front side body region 22, and the emitter regions 20 to the upper electrode 60. The main current 76 is larger than the bypass current 74. Therefore, when the gate voltage Vg exceeds the gate-on voltage Vg2, the collector current Ic steeply increases as shown in FIG. 2.

As described above, when the magnitude of the gate voltage Vg is between the voltage Vg1 and the voltage Vg2, the bypass current 74 flows in the IGBT. A high bypass current 74 flows if the resistance of the IGBT pillar regions 24 is low. In this case, as shown by a graph B1 in FIG. 2, the collector current Ic (i.e., a current Ic2) in the range between the voltage Vg1 and the voltage Vg2 is increased. Therefore, when the gate voltage Vg is increased, the collector current Ic increases stepwise in two steps.

In contrast, in the semiconductor device 10, the width W1 of the IGBT pillar regions 24 is small, and thereby the resistance of the IGBT pillar regions 24 is high. Thus, the bypass current 74 flowing in the IGBT is small. The IGBT pillar regions 24 having the high resistance suppress the bypass current 74. Therefore, as shown by the graph A1 in FIG. 2, the collector current Ic (i.e., the current Ic1) in the range between the voltage Vg1 and the voltage Vg2 is negligibly small.

In the manufacturing process of the semiconductor device 10, the barrier region 23 may have a local formation defect, and a portion of the n-type barrier region 23 may be lost (hereinafter, referred to as a barrier region formation defect). Even in the case where such barrier region formation defect occurs, the collector current Ic increases stepwise in two steps as shown by the graph B1 in FIG. 2. If the standard characteristic of the IGBT is the characteristic that the collector current Ic increases stepwise as shown by the graph B1, the IGBT in which the barrier region formation defect occurs cannot be screened on the basis of the characteristic. In contrast, in the semiconductor device 10 according to the present embodiment, since the bypass current 74 is small, it is possible to distinguish between the standard characteristic and the characteristic in which the barrier region formation defect occurs. Therefore, the semiconductor device in which the barrier region formation defect occurs can be easily screened. The semiconductor device 10 according to First Embodiment can be suitably manufactured.

In First Embodiment described above, the width of the IGBT pillar regions 24 is substantially constant regardless of the position in the thickness direction of the semiconductor substrate 12. In addition, the width of the diode pillar regions 36 is substantially constant regardless of the position in the thickness direction of the semiconductor substrate 12. However, the width of the pillar regions 24, 36 may be varied in accordance with the position in the thickness direction. In this case, the width of the narrowest portion of the IGBT pillar regions 24 can be made smaller than the width of the narrowest portion of the diode pillar regions 36. Thus, the resistance of the IGBT pillar regions 24 can be made higher than the resistance of the diode pillar regions 36.

Figure 5:
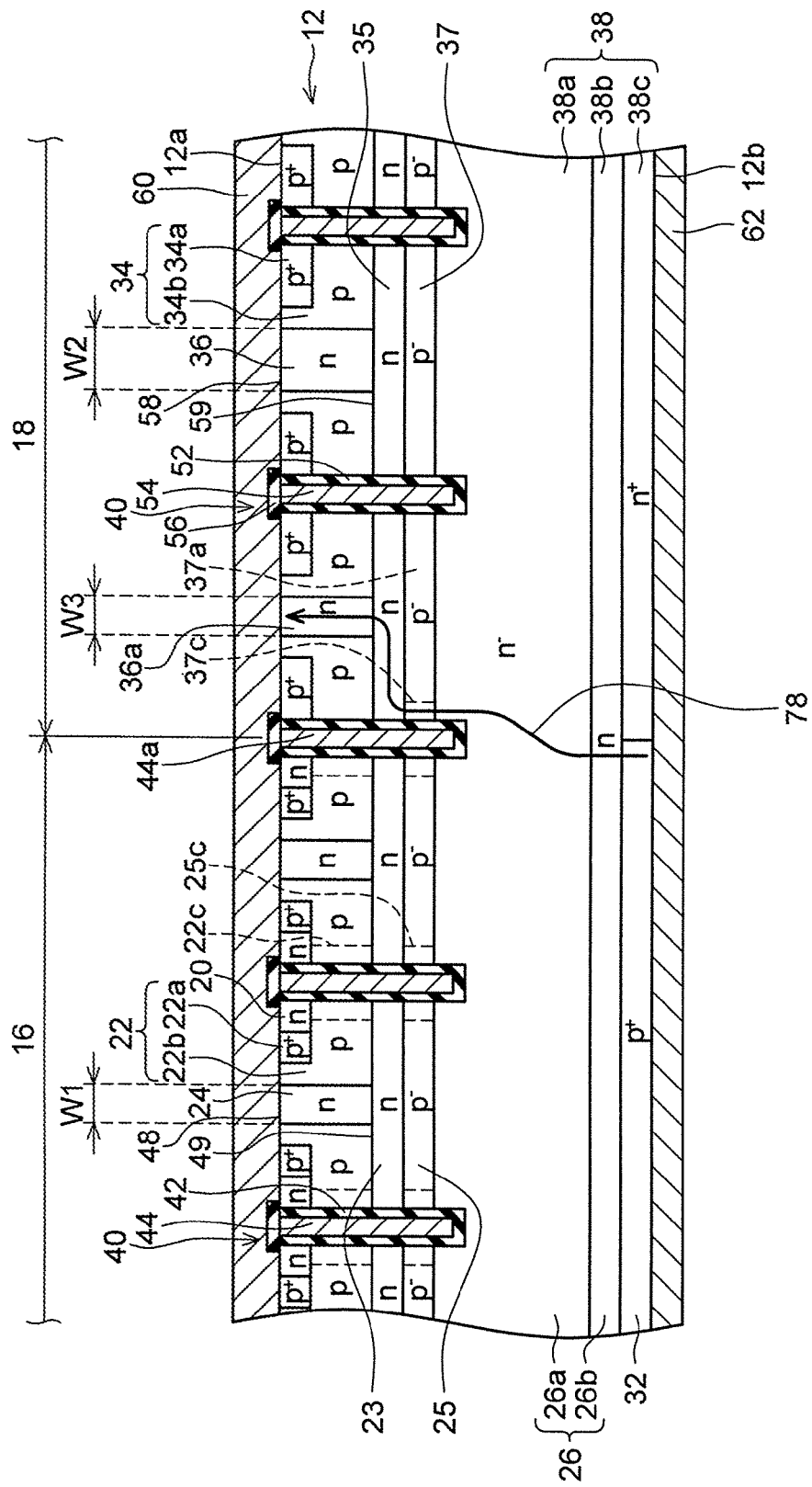
FIG. 5 is a vertical cross-sectional view of a semiconductor device according to a modification of First Embodiment.

In First Embodiment described above, as shown in FIG. 5, a width W3 of a diode pillar region 36a located near the IGBT region 16 (i.e., the diode pillar region 36a located near a gate electrode 44a at the boundary between the IGBT region 16 and the diode region 18) may be smaller than the width W2 of the other diode pillar regions 36. That is, the cross-sectional area of the diode pillar region 36a may be smaller than the cross-sectional area of the other diode pillar regions 36. For example, the width W3 may be almost equal to the width W1. When the gate-on voltage is applied to the gate electrodes 44, a channel is formed in a range adjacent to the gate insulating film 42 in a back side anode region 37a adjacent to the gate electrode 44a (hereinafter, this range is referred to as a gate vicinity region 37c). Therefore, as shown in FIG. 5, a bypass current 78 flows from the lower electrode 62 through the collector region 32, the drift region 26, the channel in the back side anode region 37a, the diode barrier region 35, and the diode pillar region 36a to the upper electrode 60. By reducing the width W3 of the diode pillar region 36a at the position closest to the gate electrode 44a as shown in FIG. 5, the resistance of the diode pillar region 36a becomes higher than the resistance of the other diode pillar regions 36, whereby the bypass current 78 can be suppressed.

Second Embodiment

Figure 6:
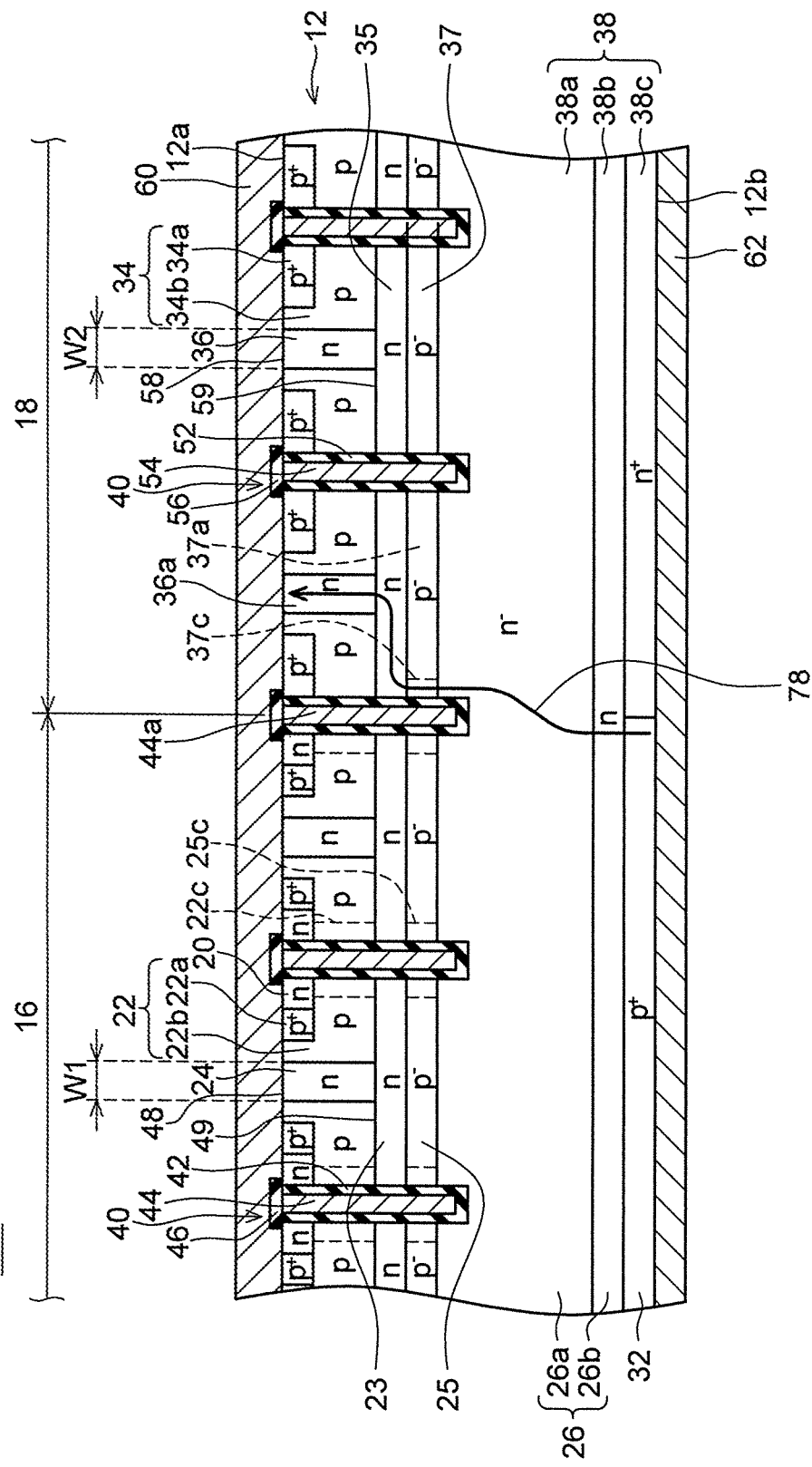
FIG. 6 is a vertical cross-sectional view of a semiconductor device 210 according to Second Embodiment.

In a semiconductor device 210 according to Second Embodiment shown in FIG. 6, the width W1 of the IGBT pillar regions 24 is substantially equal to the width W2 of the diode pillar regions 36. In addition, in the semiconductor device 210, the n-type impurity concentration of the IGBT pillar regions 24 is lower than the n-type impurity concentration of the diode pillar regions 36. The configuration of the semiconductor device 210 according to Second Embodiment is identical to the configuration of the semiconductor device 10 according to First Embodiment except the above points.

As described above, in the semiconductor device 210 according to Second Embodiment, the n-type impurity concentration of the IGBT pillar regions 24 is lower than the n-type impurity concentration of the diode pillar regions 36. Therefore, also in the semiconductor device 210 according to Second Embodiment, the resistance of the IGBT pillar regions 24 is higher than the resistance of the diode pillar regions 36, as in the semiconductor device 10 according to the First Embodiment. That is, when a gate-off voltage is applied to the gate electrodes 44, the resistance between the IGBT barrier region 23 and the upper electrode 60 is higher than the resistance between the diode barrier region 35 and the upper electrode 60.

Also in the semiconductor device 210 according to Second Embodiment, the reverse recovery current in the diode is suppressed as in the semiconductor device 10 according to First Embodiment. In particular, since the resistance of the diode pillar regions 36 is low, the reverse recovery current can be effectively suppressed.

Further, also in the semiconductor device 210 according to Second Embodiment, the bypass current 74 is suppressed as in the semiconductor device 10 according to First Embodiment. That is, since the resistance of the IGBT pillar regions 24 is high, the bypass current 74 can be effectively suppressed. Accordingly, in the case of mass-producing the semiconductor device 210 according to Second Embodiment, semiconductor devices in which barrier region formation defects occur can be screened on the basis of the characteristics thereof. Thus, the semiconductor device 210 according to Second Embodiment can be suitably manufactured.

In Second Embodiment, the n-type impurity concentration of the diode pillar region 36a located near the IGBT region 16 (i.e., the diode pillar region 36a located near the gate electrode 44a at the boundary between the IGBT region 16 and the diode region 18) may be lower than the n-type impurity concentration of the other diode pillar regions 36. For example, the n-type impurity concentration of the diode pillar region 36a may be substantially equal to the n-type impurity concentration of the IGBT pillar regions 24. By reducing the n-type impurity concentration of the diode pillar region 36a at the position closest to the gate electrode 44a at the boundary, the resistance of the diode pillar region 36a becomes higher than the resistance of the other diode pillar regions 36, whereby the bypass current 78 can be suppressed.

Third Embodiment

Figure 7:
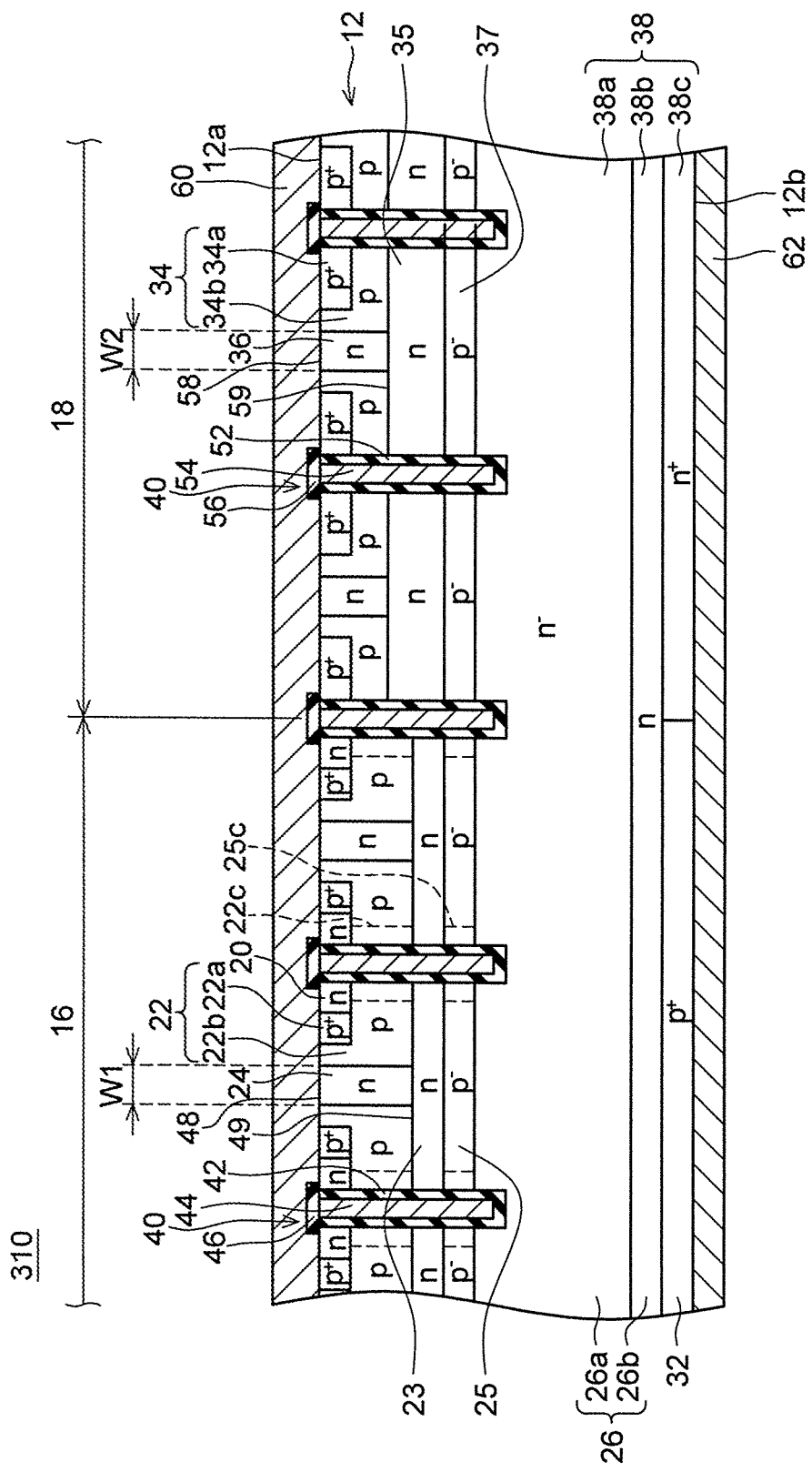
FIG. 7 is a vertical cross-sectional view of a semiconductor device 310 according to Third Embodiment.

In a semiconductor device 310 according to Third Embodiment shown in FIG. 7, the width W1 of the IGBT pillar regions 24 is substantially equal to the width W2 of the diode pillar regions 36. In addition, in the semiconductor device 310, the thickness of the diode barrier region 35 is larger than the thickness of the IGBT barrier region 23. Therefore, the upper surface (i.e., the p-n junction 59) of the diode barrier region 35 is located at a position higher than the upper surface (i.e., the p-n junction 49) of the IGBT barrier region 23. Accordingly, the IGBT pillar regions 24 are longer than the diode pillar regions 36 in the thickness direction of the semiconductor substrate 12. The configuration of the semiconductor device 310 according to Third Embodiment is identical to the configuration of the semiconductor device 10 according to First Embodiment except the above points.

As described above, in the semiconductor device 310 according to Third Embodiment, the IGBT pillar regions 24 are longer than the diode pillar regions 36 in the thickness direction of the semiconductor substrate 12. Therefore, also in the semiconductor device 310 according to Third Embodiment, the resistance of the IGBT pillar regions 24 is higher than the resistance of the diode pillar regions 36 as in the semiconductor device 10 according to First Embodiment. That is, when the gate-off voltage is applied to the gate electrodes 44, the resistance between the IGBT barrier region 23 and the upper electrode 60 is higher than the resistance between the diode barrier region 35 and the upper electrode 60.

Also in the semiconductor device 310 according to Third Embodiment, the reverse recovery current of the diode is suppressed as in the semiconductor device 10 according to First Embodiment. In particular, since the resistance of the diode pillar regions 36 is low, the reverse recovery current can be effectively suppressed.

Further, also in the semiconductor device 310 according to Third Embodiment, the bypass current 74 is suppressed as in the semiconductor device 10 according to First Embodiment. That is, since the resistance of the IGBT pillar regions 24 is high, the bypass current 74 can be effectively suppressed. Accordingly, in the case of mass-producing the semiconductor device 310 according to Third Embodiment, semiconductor devices in which barrier region formation defects occur can be screened on the basis of the characteristics thereof. Thus, the semiconductor device 310 according to Third Embodiment can be suitably manufactured.

Figure 8:
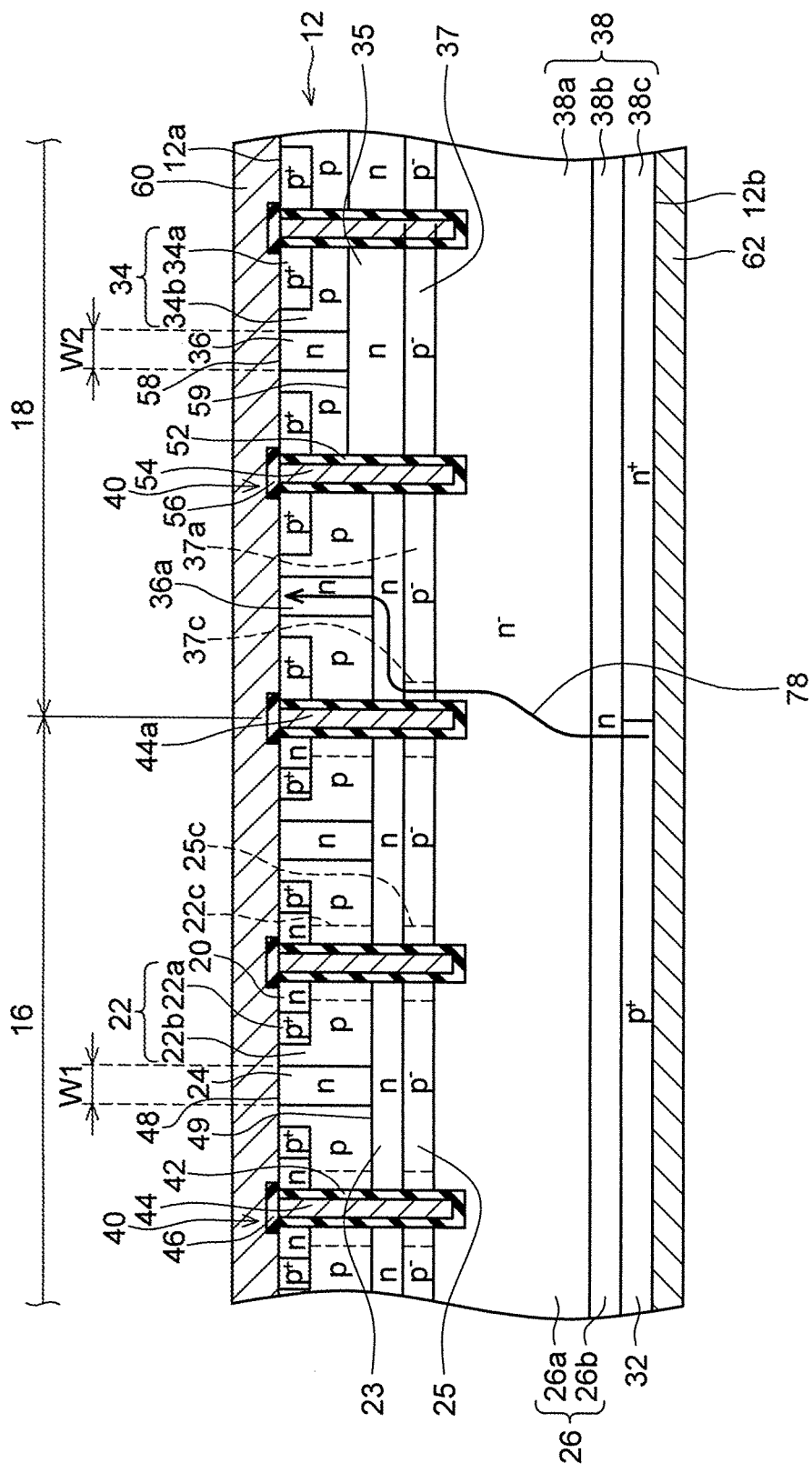
FIG. 8 is a vertical cross-sectional view of a semiconductor device according to a modification of Third Embodiment.

In Third Embodiment, as shown in FIG. 8, the length (i.e., the length in the thickness direction of the semiconductor substrate 12) of the diode pillar region 36a located near the IGBT region 16 (i.e., the diode pillar region 36a located near the gate electrode 44a at the boundary between the IGBT region 16 and the diode region 18) may be longer than the length (i.e., the length in the thickness direction of the semiconductor substrate 12) of the other diode pillar regions 36. For example, the length of the diode pillar region 36a may be substantially equal to the length of the IGBT pillar regions 24. By increasing the length of the diode pillar region 36a at the position closest to the gate electrode 44a at the boundary, the resistance of the diode pillar region 36a becomes higher than the resistance of the other diode pillar regions 36, whereby the bypass current 78 can be suppressed.

Fourth Embodiment

Figure 9:
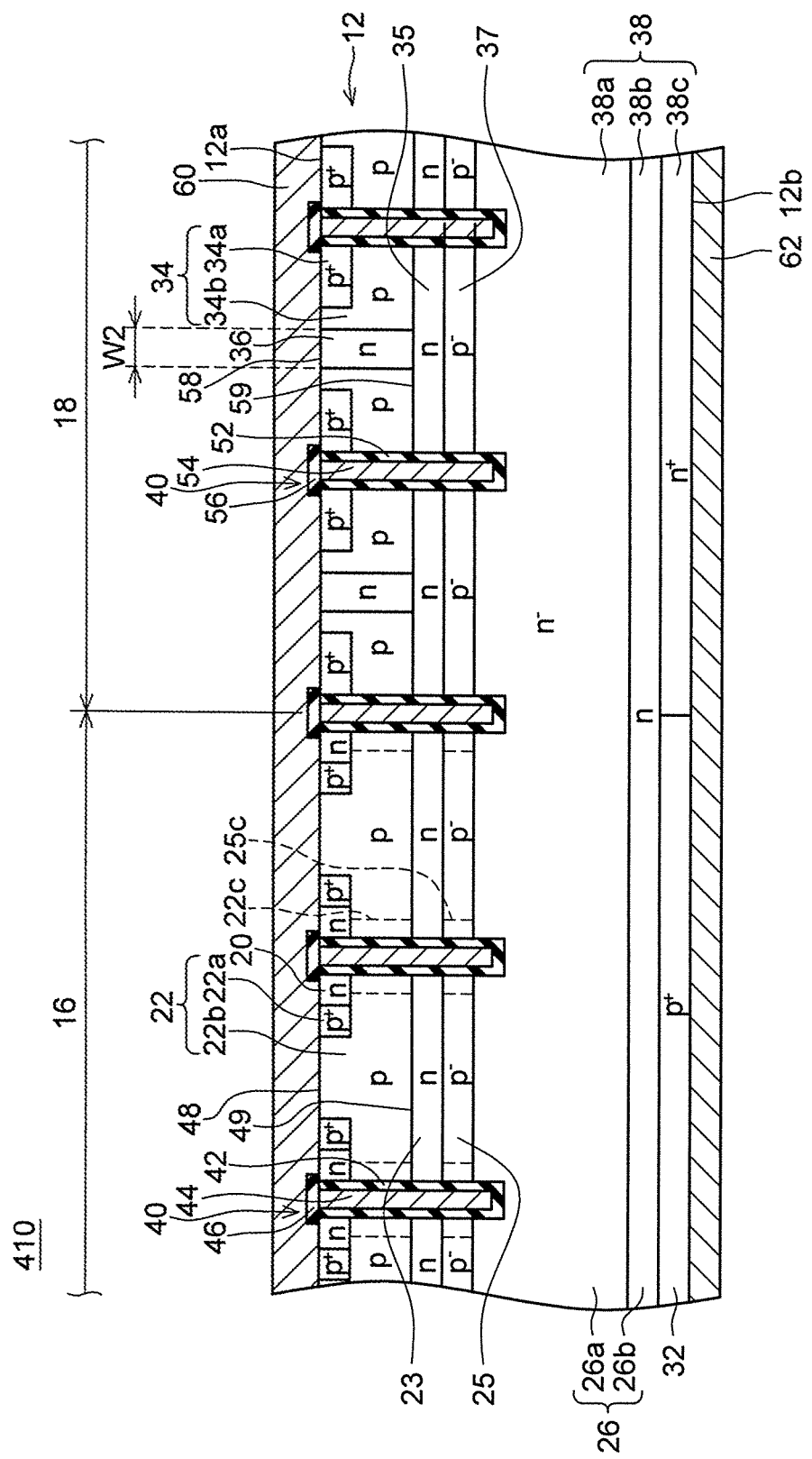
FIG. 9 is a vertical cross-sectional view of a semiconductor device 410 according to Fourth Embodiment.

A semiconductor device 410 according to Fourth Embodiment shown in FIG. 9 does not have any IGBT pillar region 24. Therefore, the IGBT barrier region 23 is electrically separated from the upper electrode 60 by the front side body region 22. The configuration of the semiconductor device 410 according to Fourth Embodiment is identical to the configuration of the semiconductor device 10 according to First Embodiment except the above points.

As described above, the semiconductor device 410 according to the Fourth Embodiment does not have any IGBT pillar region 24. Therefore, in the semiconductor device 410 according to Fourth Embodiment, when the gate-off voltage is applied to the gate electrodes 44, the resistance between the IGBT barrier region 23 and the upper electrode 60 is extremely high. Accordingly, also in the semiconductor device 410 according to Fourth Embodiment, when the gate-off voltage is applied to the gate electrodes 44, the resistance between the IGBT barrier region 23 and the upper electrode 60 is higher than the resistance between the diode barrier region 35 and the upper electrode 60, as in the semiconductor device 10 according to First Embodiment.

Also in the semiconductor device 410 according to Fourth Embodiment, the reverse recovery current of the diode is suppressed as in the semiconductor device 10 according to First Embodiment. In particular, since the resistance of the diode pillar regions 36 is low, the reverse recovery current can be effectively suppressed.

In the semiconductor device 410 according to Fourth Embodiment, since the IGBT pillar region 24 is absent, the bypass current 74 does not flow. Accordingly, in the case of mass-producing the semiconductor device 410 according to Fourth Embodiment, semiconductor devices in which barrier region formation defects occur can be screened on the basis of the characteristics thereof. Thus, the semiconductor device 410 according to Fourth Embodiment can be suitably manufactured.

The absence of the IGBT pillar region 24 in the IGBT region 16 as in Fourth Embodiment allows the holes to be easily injected into the low-concentration drift region 26a from the front side body region 22 in the IGBT region 16 when the forward voltage is applied to the diode. That is, the p-n junction 49 is easily turned on. Accordingly, the reverse recovery current becomes a little greater in the configuration according to Fourth Embodiment than in the configurations according to First to Third Embodiments.

In First to Fourth Embodiments described above, the control electrodes 54 are provided in the diode region 18. However, the control electrodes 54 are not necessarily provided in the diode region 18.

The semiconductor devices according to First to Fourth Embodiments each include the upper electrode 60 in which the anode electrode and the emitter electrode are configured as a single common electrode. However, the anode electrode may be separated from the emitter electrode. In addition, the semiconductor devices according to First to Fourth Embodiments each include the lower electrode 62 in which the cathode electrode and the collector electrode are configured as a single common electrode. However, the cathode electrode may be separated from the collector electrode.

In the First to Fourth Embodiments described above, the pillar regions 24 and 36 are in Schottky contact with the upper electrode 60. However, the pillar regions 24 and 36 may be in ohmic contact with the upper electrode 60. Also in this configuration, the bypass current can be suppressed by increasing the resistance of the IGBT pillar regions 24.

The above-described resistance adjusting methods based on the cross-sectional area (width) of the pillar region, the n-type impurity concentration thereof, and the length thereof may be appropriately combined.

Hereinafter, a description will be given of the relationship between the components of the above-described Embodiments and the components described in claims. The upper electrode 60 according to the Embodiments is an example of an anode electrode and an emitter electrode of the claims. The lower electrode 62 according to the Embodiments is an example of a cathode electrode and a collector electrode of the claims.

The technical elements disclosed in the present specification will be listed below. The respective technical elements are independently useful.

In an exemplary semiconductor device disclosed in the present specification, an IGBT region may have an n-type IGBT pillar region which reaches an IGBT barrier region through a front side body region from a front surface of a semiconductor substrate, and is connected to an emitter electrode.

According to this configuration, when a diode is turned on, injection of holes into a cathode region can be suppressed by a parasitic diode included in the IGBT. Therefore, a reverse recovery current of the diode can be suppressed more effectively.

In an exemplary semiconductor device disclosed in the present specification, a cross-sectional area of the IGBT pillar region in a plane vertical to the thickness direction of the semiconductor substrate may be smaller than a cross-sectional area of a diode pillar region in the plane.

According to this configuration, the resistance of the IGBT pillar region can be made higher than the resistance of the diode pillar region.

In an exemplary semiconductor device disclosed in the present specification, a diode region may include a first diode pillar region, and a second diode pillar region disposed at a location farther away from the IGBT region than the first diode pillar region. The cross-sectional area of the first diode pillar region may be smaller than the cross-sectional area of the second diode pillar region.

According to this configuration, a bypass current flowing across the boundary between the IGBT region and the diode region can be suppressed.

In an exemplary semiconductor device disclosed in the present specification, the n-type impurity concentration of the IGBT pillar region may be lower than the n-type impurity concentration of the diode pillar region.

According to this configuration, the resistance of the IGBT pillar region can be made higher than the resistance of the diode pillar region.

In an exemplary semiconductor device disclosed in the present specification, the diode region may include a first diode pillar region, and a second diode pillar region disposed at a location farther away from the IGBT region than the first diode pillar region. The n-type impurity concentration of the first diode pillar region may be lower than the n-type impurity concentration of the second diode pillar region.

According to this configuration, the bypass current flowing across the boundary between the IGBT region and the diode region can be suppressed.

In an exemplary semiconductor device disclosed in the present specification, the IGBT pillar region may be longer than the diode pillar region in the thickness direction of the semiconductor substrate.

According to this configuration, the resistance of the IGBT pillar region can be made higher than the resistance of the diode pillar region.

In an exemplary semiconductor device disclosed in the present specification, the diode region may include a first diode pillar region, and a second diode pillar region disposed at a location farther away from the IGBT region than the first diode pillar region. The first diode pillar region may be longer than the second diode pillar region in the thickness direction of the semiconductor substrate.

According to this configuration, the bypass current flowing across the boundary between the IGBT region and the diode region can be suppressed.

Specific examples of the present specification are described above in detail, but these examples are merely illustrative and place no limitation on the scope of the claims. The technology described in the claims also encompasses various changes and modifications to the specific examples described above. The technical elements explained in the present specification or drawings provide technical utility either independently or through various combinations. The present specification is not limited to the combinations described at the time the claims are filed. Further, the purpose of the examples shown by the present specification or drawings is to satisfy multiple objectives simultaneously, and satisfying any one of those objectives gives technical utility to the present specification.

What is claimed is:

1. A semiconductor device comprising:
a semiconductor substrate including a diode region and an IGBT region;
an anode electrode provided on a front surface of the semiconductor substrate in the diode region;
a cathode electrode provided on a rear surface of the semiconductor substrate in the diode region;
an emitter electrode provided on the front surface of the semiconductor substrate in the IGBT region;
a collector electrode provided on the rear surface of the semiconductor substrate in the IGBT region;
a gate insulating film; and
a gate electrode,
wherein the diode region comprises:
a p-type front side anode region connected to the anode electrode;
an n-type diode barrier region provided on a back side of the front side anode region;
an n-type diode pillar region connected to the anode electrode, the diode pillar region reaching the diode barrier region through the front side anode region from the front surface of the semiconductor substrate;

a p-type back side anode region provided on a back side of the diode barrier region, separated from the front side anode region by the diode barrier region, and having a p-type impurity concentration lower than a p-type impurity concentration of the front side anode region; and an n-type cathode region provided on a back side of the back side anode region, separated from the diode barrier region by the back side anode region, and connected to the cathode electrode, the IGBT region comprises:

an n-type emitter region connected to the emitter electrode;

a p-type front side body region provided on a back side of the emitter region;

an n-type IGBT barrier region provided on a back side of the front side body region and separated from the emitter region by the front side body region;

a p-type back side body region provided on a back side of the IGBT barrier region, separated from the front side body region by the IGBT barrier region, and having a p-type impurity concentration lower than a p-type impurity concentration of the front side body region;

an n-type IGBT drift region provided on a back side of the back side body region, separated from the IGBT barrier region by the back side body region, and connected to the cathode region; and a p-type collector region provided on a back side of the IGBT drift region, separated from the back side body region by the IGBT drift region, and connected to the collector electrode, wherein the gate electrode faces, via the gate insulating film, the front side body region and the back side body region that are located in a range where the emitter region and the IGBT drift region are separated by the front side body region and the side body region, and a resistance between the IGBT barrier region and the emitter electrode is higher than a resistance between the diode barrier region and the anode electrode when a gate-off voltage is applied to the gate electrode.

2. The semiconductor device according to claim 1, wherein the IGBT region further comprises an n-type IGBT pillar region, and the IGBT pillar region reaches the IGBT barrier region through the front side body region from the front surface of the semiconductor substrate, and is connected to the emitter electrode.

3. The semiconductor device according to claim 2, wherein a cross-sectional area of the IGBT pillar region in a plane vertical to a thickness direction of the semiconductor substrate is smaller than a cross-sectional area of the diode pillar region in the plane.

4. The semiconductor device according to claim 3, wherein the diode region comprises:

a first diode pillar region; and a second diode pillar region disposed at a location farther away from the IGBT region than the first diode pillar region, and a cross-sectional area of the first diode pillar region in the plane is smaller than a cross-sectional area of the second diode pillar region in the plane.

5. The semiconductor device according to claim 2, wherein an n-type impurity concentration of the IGBT pillar region is lower than an n-type impurity concentration of the diode pillar region.

6. The semiconductor device according to claim 5, wherein the diode region comprises:

a first diode pillar region; and a second diode pillar region disposed at a location farther away from the IGBT region than the first diode pillar region, and an n-type impurity concentration of the first diode pillar region is smaller than an n-type impurity concentration of the second diode pillar region.

7. The semiconductor device according to claim 2, wherein the IGBT pillar region is longer than the diode pillar region in a thickness direction of the semiconductor substrate.

8. The semiconductor device according to claim 7, wherein the diode region comprises:

a first diode pillar region; and a second diode pillar region disposed at a location farther away from the IGBT region than the first diode pillar region, and the first diode pillar region is longer than the second diode pillar region in the thickness direction of the semiconductor substrate.

* * * * *